(12) United States Patent
Kuo

(10) Patent No.: US 9,899,832 B2
(45) Date of Patent: Feb. 20, 2018

(54) WEARABLE DEVICE AND ELECTROSTATIC DISCHARGE PROTECTION CIRCUIT OF THE SAME

(71) Applicant: HTC Corporation, Taoyuan (TW)

(72) Inventor: Ching-Yen Kuo, Taoyuan (TW)

(73) Assignee: HTC Corporation, Taoyuan (TW)

( * ) Notice: Subject to any disclaimer, the term of this patent is extended or adjusted under 35 U.S.C. 154(b) by 242 days.

(21) Appl. No.: 14/833,136

(22) Filed: Aug. 23, 2015

(65) Prior Publication Data

US 2017/0054289 A1    Feb. 23, 2017

(51) Int. Cl.
| | |
|---|---|
| *H02J 7/04* | (2006.01) |
| *H02J 7/16* | (2006.01) |
| *H02H 9/04* | (2006.01) |
| *G06F 1/16* | (2006.01) |
| *H02J 7/00* | (2006.01) |
| *G04G 21/00* | (2010.01) |
| *G06F 1/26* | (2006.01) |

(Continued)

(52) U.S. Cl.
CPC ............ *H02H 9/04* (2013.01); *G04G 21/00* (2013.01); *G06F 1/163* (2013.01); *G06F 1/263* (2013.01); *H01R 13/6485* (2013.01); *H02H 9/046* (2013.01); *H02J 7/007* (2013.01); *H02J 7/0036* (2013.01); *H05K 1/0259* (2013.01)

(58) Field of Classification Search
CPC ...................................................... H02H 9/04
USPC ........................................................ 320/162
See application file for complete search history.

(56) References Cited

U.S. PATENT DOCUMENTS 9,780,594 B2 * 10/2017 Sato .................. H02J 7/007
2003/0146736 A1 * 8/2003 Kosuda ............... G04C 10/00
320/132

(Continued)

FOREIGN PATENT DOCUMENTS

EP         2387153 A2    11/2011
EP         2387153 A3    11/2011
(Continued)

OTHER PUBLICATIONS

The extended European Search Report dated Jan. 9, 2017.
Corresponding Office Action that these art references were cited on Mar. 11, 2016.

*Primary Examiner* — Suresh Memula
(74) *Attorney, Agent, or Firm* — CKC & Partners Co., Ltd.

(57) ABSTRACT

A wearable device is provided. The wearable device includes a first functional module, at least one exposed contact, a second functional module, an ESD protection circuit that converts an ESD input to an output voltage when the ESD input occurs, a detection module that detects whether the exposed contact is connected to an external electronic module, a switch module and a processing module. The switch module electrically connects the exposed contact and the second functional module when the exposed contact is connected to the external electronic module to perform a transmission behavior with the second functional module through the exposed contact. The switch module electrically connects the exposed contact and the ESD protection circuit when the exposed contact is not connected to the external electronic module. The processing module receives the input voltage to reset the first function module according to the input voltage.

17 Claims, 5 Drawing Sheets

(51) Int. Cl.
*H01R 13/648* (2006.01)
*H05K 1/02* (2006.01)

(56) References Cited

U.S. PATENT DOCUMENTS

| | | | | |
|---|---|---|---|---|
| 2009/0121682 A1* | 5/2009 | Goto | ............... | H01M 2/34 |
| | | | | 320/134 |
| 2014/0375118 A1* | 12/2014 | Namuduri | ............ | B60R 16/033 |
| | | | | 307/9.1 |
| 2015/0054571 A1 | 2/2015 | Watanabe et al. | | |
| 2016/0181840 A1* | 6/2016 | Kang | ............... | H02J 7/0045 |
| | | | | 320/107 |

FOREIGN PATENT DOCUMENTS

| | | | |
|---|---|---|---|
| TW | 200721612 | A | 6/2007 |
| TW | 201405762 | A | 2/2014 |
| TW | I447896 | B | 8/2014 |
| WO | 9852145 | A1 | 11/1998 |
| WO | 2008085166 | A1 | 7/2008 |

\* cited by examiner

WEARABLE DEVICE AND ELECTROSTATIC DISCHARGE PROTECTION CIRCUIT OF THE SAME

BACKGROUND

Field of Invention

The present disclosure relates to an electrostatic discharge (ESD) protection technology. More particularly, the present disclosure relates to a wearable device and an ESD protection circuit of the same.

Description of Related Art

A wearable device can be any electronic device that can be put on the user, such as but not limited to an electronic watch, electronic bracelet, an electronic necklace, a head mounted display device or a smart glass. The wearable device can be either be an independent electronic device or can be cooperative with a handheld electronic device such as a smartphone to accomplish extended applications and provide the use convenient functions.

However, in order to keep the electricity or to exchange information, exposed contacts are disposed on the wearable device such that the wearable device can be charged or can perform transmission of the data. The electrical charges generated by the ESD are likely to be transmitted to inner components of the wearable device through the exposed contacts. As compared to components in the handheld electronic device, the size of the inner components of the wearable device is too small to bear the ESD. False action of the inner components may occur due to the influence of the ESD.

Accordingly, what is needed is a wearable device and an ESD protection circuit to address the above issues.

SUMMARY

An aspect of the present disclosure is to provide an ESD protection circuit used in a wearable device. The ESD protection circuit includes a clamping unit, a first capacitive unit and a second capacitive unit. The clamping unit is electrically coupled to an ESD input terminal to clamp an input voltage of the ESD input terminal below a predetermined level when an ESD input having a first voltage value occurs. The first capacitive unit includes a first terminal and a second terminal, wherein the first terminal is electrically coupled to the ESD input terminal to filter a direct current (DC) part of the input voltage, and the second terminal is electrically coupled to a voltage output terminal. The second capacitive unit is electrically coupled between the voltage output terminal and a ground terminal so as to discharge to an external circuit through the voltage output terminal to generate an output voltage having a second voltage value after being charged according to the input voltage from the first capacitive unit, wherein the second voltage value is smaller than the first voltage value.

Another aspect of the present disclosure is to provide a wearable device. The wearable device includes a first functional module, at least one exposed contact, a second functional module, an ESD protection circuit, a detection module, a switch module and a processing module. The ESD protection circuit includes an ESD input terminal and a voltage output terminal wherein when an ESD input occurs at the ESD input terminal, the ESD protection circuit converts the ESD input having a first voltage value to an output voltage having a second voltage value at the voltage output terminal, wherein the second voltage value is smaller than the first voltage value. The detection module detects whether the exposed contact is connected to an external electronic module. The switch module electrically connects the exposed contact and the second functional module when the detection module determines that the exposed contact is connected to the external electronic module such that the external electronic module performs a transmission behavior with the second functional module through the exposed contact, and electrically connects the exposed contact and the ESD protection circuit when the detection module determines that the exposed contact is not connected to the external electronic module. The processing module receives the output voltage to reset the first function module according to the output voltage.

Yet another aspect of the present disclosure is to provide a wearable device. The wearable device includes at least one exposed contact, a functional module, an ESD protection circuit, a detection module and a switch module. The ESD protection circuit includes an open-circuit terminal, wherein when an ESD input occurs, the ESD protection circuit guides the ESD input to the open-circuit terminal. The detection module detects whether the exposed contact is connected to an external electronic module. The switch module electrically connects the exposed contact and the functional module when the detection module determines that the exposed contact is connected to the external electronic module such that the external electronic module performs a transmission behavior with the functional module through the exposed contact, and electrically connects the exposed contact and the ESD protection circuit when the detection module determines that the exposed contact is not connected to the external electronic module.

Still another aspect of the present disclosure is to provide a wearable device. The wearable device includes a first functional module, at least one exposed contact, a second functional module, an ESD protection circuit and a processing module. The second functional module is electrically coupled to the exposed contact such that when the exposed contact is connected to an external electronic module, the external electronic module performs a transmission behavior with the second functional module through the exposed contact. The ESD protection circuit includes an ESD input terminal and a voltage output terminal, wherein the ESD input terminal is electrically coupled between the exposed contact and the second functional module such that when an ESD input occurs at the ESD input terminal, the ESD protection circuit converts the ESD input having a first voltage value to an output voltage having a second voltage value at the voltage output terminal, wherein the second voltage value is smaller than the first voltage value. The processing module receives the output voltage to reset the first function module according to the output voltage.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
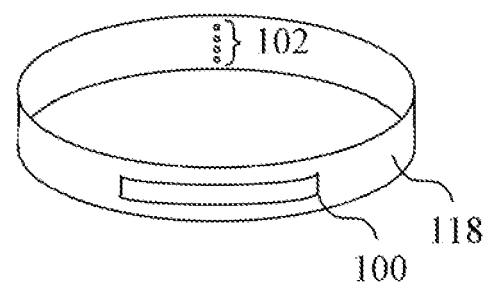
FIG. 1A is a diagram of a wearable device in an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1B:
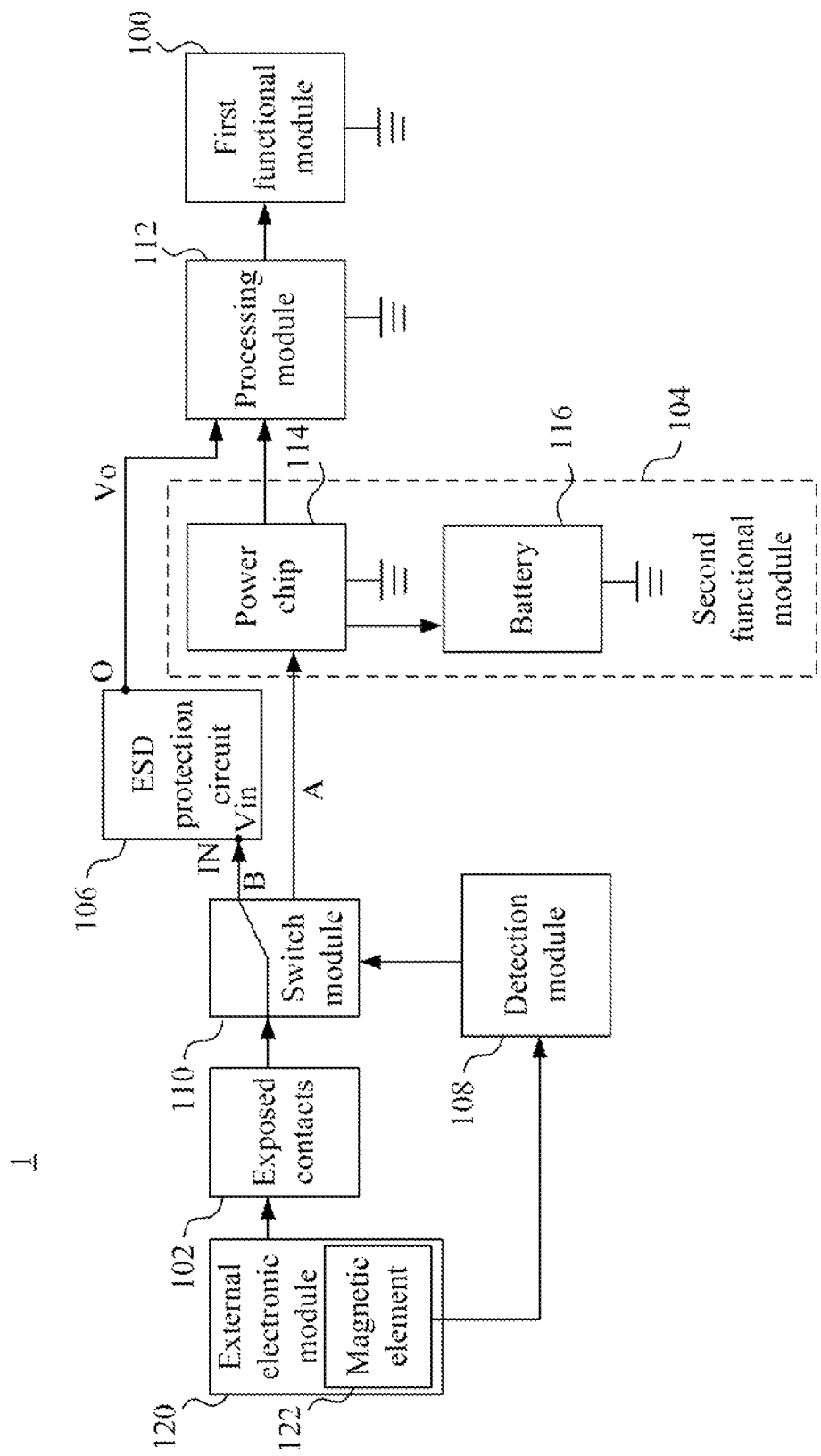
FIG. 1B is a block diagram of the wearable device in FIG. 1A in an embodiment of the present disclosure.
Figure 2:
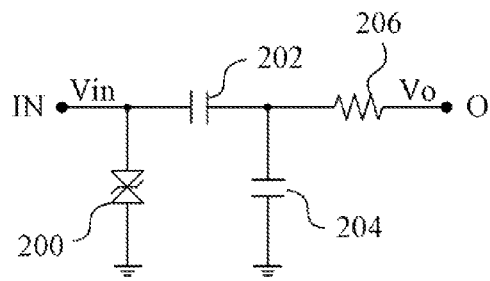
FIG. 2 is a circuit diagram of the ESD protection circuit in FIG. 1B in an embodiment of the present disclosure.

Reference is now made to FIG. 1A and FIG. 1B. FIG. 1A is a diagram of a wearable device 1 in an embodiment of the present disclosure. FIG. 1B is a block diagram of the wearable device 1 in FIG. 1A in an embodiment of the present disclosure. The wearable device 1 can be any electronic device that can be put on a user, such as but not limited to an electronic watch, electronic bracelet, an electronic necklace, a head mounted display device or a smart glasses.

The wearable device 1 includes a first functional module 100, exposed contacts 102, a second functional module 104, an ESD protection circuit 106, a detection module 108, a switch module 110 and a processing module 112.

The first functional module 100 can be a module in the wearable device 1 to perform a specific function, such as but not limited to a display module or a communication module. The exposed contacts 102 are contacts exposed outside of the main body of the wearable device 1 to be electrically coupled to an external electronic device 120.

The second functional module 104 can be a module in the wearable device 1 to perform a transmission behavior with the external electronic module 120, such as but not limited to a power module that includes a power chip 114 and a battery 116. The external electronic module 120 can perform the transmission behavior mentioned above with the second functional module 104 through the exposed contacts 102. For example, when the second functional module 104 is the power module mentioned above, the external electronic module 120 can be a charger, and the exposed contacts can be charging contacts. As a result, when the charger and the charging contacts are electrically coupled, the charger can charge the battery 116 through the charging contacts and the power chip 114.

In other embodiments, the external electronic module 120 can also be other kinds of external electronic device, such as but not limited to a handheld electronic device implemented by a smartphone. The second functional module 104 can also be such as but not limited to a data transmission module such that the external electronic module 120 performs data transmission with the second functional module 104 through the exposed contacts 102.

It is appreciated that in FIG. 1A, four exposed contacts 102 are exemplarily illustrated. However, in different embodiments, the number of the exposed contacts 102 disposed thereon depends on practical needs. In an embodiment, the housing of the wearable device 1 is manufactured by insulating material. Under such a condition, only the exposed contacts 102 in the wearable device 1 are easy to suffer from ESD.

The ESD protection circuit 106 is a circuit to provide an ESD protection mechanism. In the present embodiment, the ESD protection circuit 106 includes an ESD input terminal IN and a voltage output terminal O. When an ESD input having a first voltage value occurs at the ESD input terminal IN, the ESD protection circuit 106 converts the ESD input to an output voltage Vo having a second voltage value at the voltage output terminal O, wherein the second voltage value is smaller than the first voltage value.

The detection module 108 detects whether the exposed contacts 102 are connected to the external electronic module 120. In an embodiment, the external electronic module 120 includes a magnetic element 122, and the detection module 108 is a magnetic element detector, such as but not limited to a Hall sensor. The detection module 108 determines that the exposed contacts 102 are connected to the external electronic module 120 when the magnetic element 122 is detected.

In another embodiment, the detection module 108 is a voltage detector to determine that the exposed contacts 102 are connected to the external electronic module 120 when a voltage value of the exposed contacts 102 larger than a predetermined value is detected.

In yet another embodiment, the detection module 108 is a mechanical detector to determine that the exposed contacts 102 are connected to the external electronic module 120 when a connection of a corresponding pair of mechanical elements (not illustrated) between the wearable device 1 and the external electronic module 120 is detected.

In still another embodiment, the detection module 108 is a proximity detector to determine that the exposed contacts 102 are connected to the external electronic module 120 when a distance shorter than a predetermined value between the wearable device 1 and the external electronic module 120 is detected.

The switch module 110 further operates according to the detection result of the detection module 108. When the detection module 108 determines that the exposed contacts 102 are connected to the external electronic module 120, the switch module 110 electrically connects the exposed contacts 102 and the second functional module 104 through a path A such that the external electronic module 120 performs the transmission behavior with the second functional module 104 through the exposed contacts 102, such as the charging behavior mentioned above.

Further, when the detection module 108 determines that the exposed contacts 102 are not connected to the external electronic module 120 the switch module 110 electrically connects the exposed contacts 102 and the ESD input terminal IN of the ESD protection circuit 106 through a path B. When the ESD enters the ESD input terminal IN through the exposed contacts 102 to form the ESD input, the ESD protection circuit 106 operates as the method described above to generate the output voltage Vo at the voltage output terminal O.

The processing module 112 receives the output voltage Vo to reset the first function module 100 according to the output voltage Vo. In an embodiment, the first functional module 100 described above is a module that is easy to perform false action due to the influence of the ESD, such as but not limited to a display module. As a result, the processing module 112 resets the first functional module 100 based on the generation of the ESD to avoid the false action of the first functional module 100 under the influence of the ESD.

In different embodiments, the processing module 112 performs different reset mechanisms according to different conditions. In an embodiment, the processing module 112 resets the first functional module 100 when the output voltage Vo is larger than a threshold value. In another embodiment, the processing module 112 resets the first functional module 100 every time the processing module 112 receives the output voltage Vo. In still another embodiment, the processing module 112 resets the first functional module 100 when a number of times that the processing module 112 receives the output voltage Vo is larger than a predetermined value. For example, the processing module 112 only resets the first functional module 100 when processing module 112 receives the output voltage Vo for such as but not limited to three times.

As a result, the advantage of the present disclosure is to avoid the damage of the inner electronic components caused by the ESD through the exposed contacts 102 of the wearable device 1 by using the ESD protection circuit 106. Moreover, the reset mechanism is activated based on the generation of the ESD input to avoid the false action of the first functional module 100 that is easy to be influenced by the ESD.

An embodiment of the ESD protection circuit 106 is described in detail in the following paragraphs to explain the ESD protection mechanism provided by the ESD protection circuit 106.

Reference is now made to FIG, 2. FIG, 2 is a circuit diagram of the ESD protection circuit 106 in FIG. 1B in an embodiment of the present disclosure. The ESD protection circuit 106 includes a clamping unit 200, a first capacitive unit 202, a second capacitive unit 204 and a resistor 206.

The clamping unit 200 is electrically coupled to an ESD input terminal IN to receive the ESD input having the first voltage value when the ESD input occurs. As illustrated in FIG. 1B, when the exposed contacts 102 are not connected to the external electronic module 120, the ESD input terminal IN is electrically coupled to the exposed contacts 102. In an embodiment, the first voltage value generated due to the ESD input from the exposed contacts 102 is an inrush large voltage that may be up to several thousand volts. The clamping unit 200 clamps the input voltage Vin of the ESD input terminal IN below a predetermined level, such as but not limited to a range between 5 volts to 20 volts. In an embodiment, the clamping unit 200 can be such as but not limited to a Schottky diode.

The first capacitive unit 202 includes a first terminal and a second terminal, wherein the first terminal is electrically coupled to the ESD input terminal IN to filter a direct current (DC) part of the input voltage Vin. The second terminal is electrically coupled to the voltage output terminal O. In the present embodiment, the second terminal of the first capacitive unit 202 is electrically coupled to the voltage output terminal O through the resistor 206, The second capacitive unit 204 is electrically coupled between the voltage output terminal O and a ground terminal GND. Similarly, in the present embodiment, the second capacitive unit 204 is electrically coupled to the voltage output terminal O through the resistor 206 The second capacitive unit 204 is charged according to the input voltage Vin from the first capacitive unit 202 and to discharge to an external circuit, such as the processing module 112 illustrated in FIG. 1B, through the voltage output terminal O to generate the output voltage Vo having a second voltage value, wherein the second voltage value is smaller than the first voltage value.

In the present embodiment, the second capacitive unit 204 suppresses the second voltage value of the output voltage Vo outputted to the external circuit to an even smaller value by using the resistor 206. In an embodiment, the output voltage Vo is in a digital form to act as a high level relative to the low level of the voltage output terminal O when there is no ESD input. The output voltage Vo thus becomes a signal to activate the reset mechanism of the processing module 112 to reset the first functional module 100.

Figure 3:
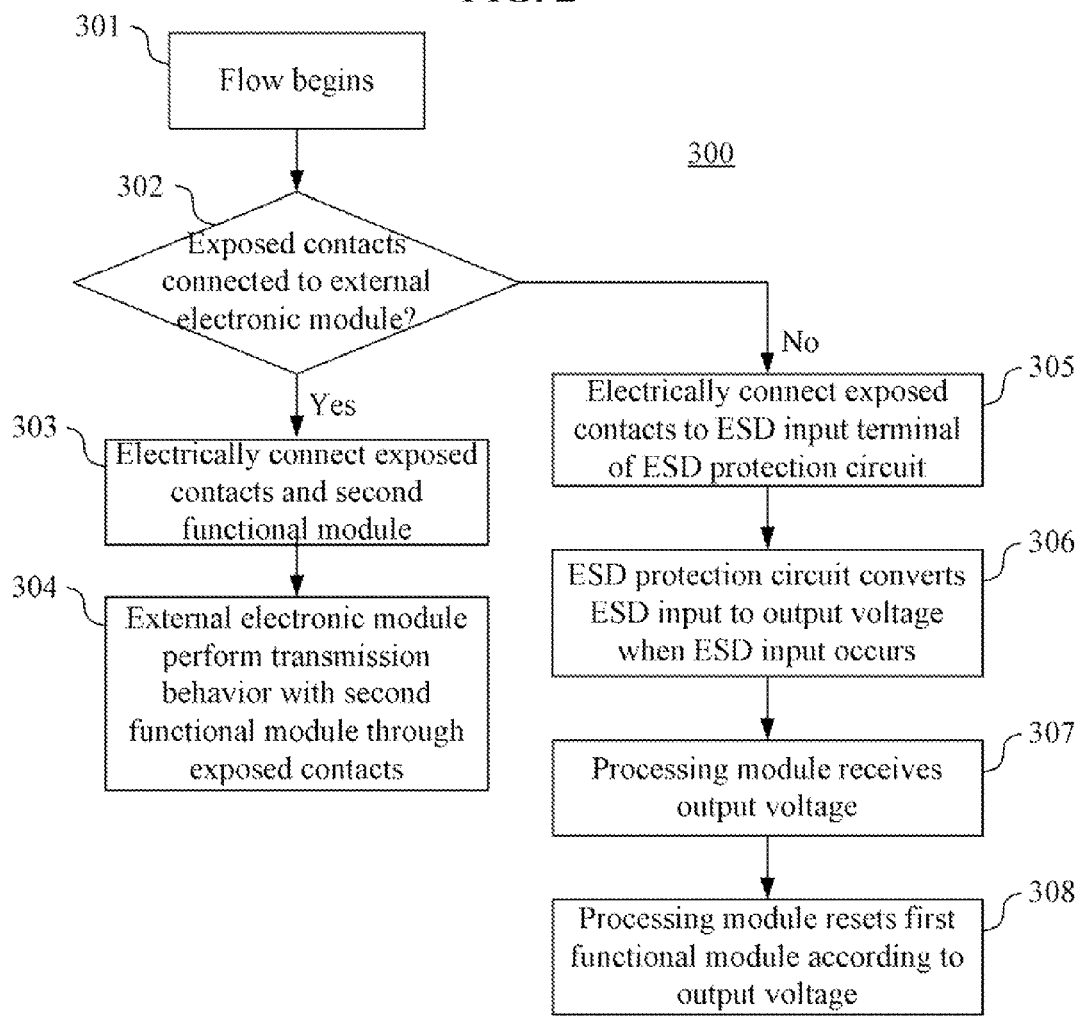
FIG. 3 is a flow chart of an ESD protection method in an embodiment of the present disclosure.

Reference is now made to FIG. 3 FIG. 3 is a flow chart of an ESD protection method 300 in an embodiment of the present disclosure. The ESD protection method 300 is used in the wearable device 1 illustrated in FIG. 1A and FIG. 18. The ESD protection method 300 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 301, the flow begins.

In step 302, the detection module 108 detects whether the exposed contacts 102 are connected to the external electronic module 120.

When the exposed contacts 102 are connected to the external electronic module 120, the switch module 110 electrically connects the exposed contacts 102 and the second functional module 104 in step 303, such that the external electronic module 120 performs the transmission behavior with the second functional module 104 through the exposed contacts 102 in step 304, such as the charging behavior mentioned above.

When the exposed contacts 102 are not connected to the external electronic module 120, the switch module 110 electrically connects the exposed contacts 102 to the ESD input terminal IN of the ESD protection circuit 106 in step 305. In step 306, the ESD protection circuit 106 converts the ESD input having the first voltage value to the output voltage having the second voltage value at the voltage output terminal.

In step 307, the processing module 112 receives the output voltage Vo, Subsequently, the processing module 112 resets the first functional module 100 according to the output voltage Vo in step 308.

Other embodiments of the wearable device are described below.

Figure 4:
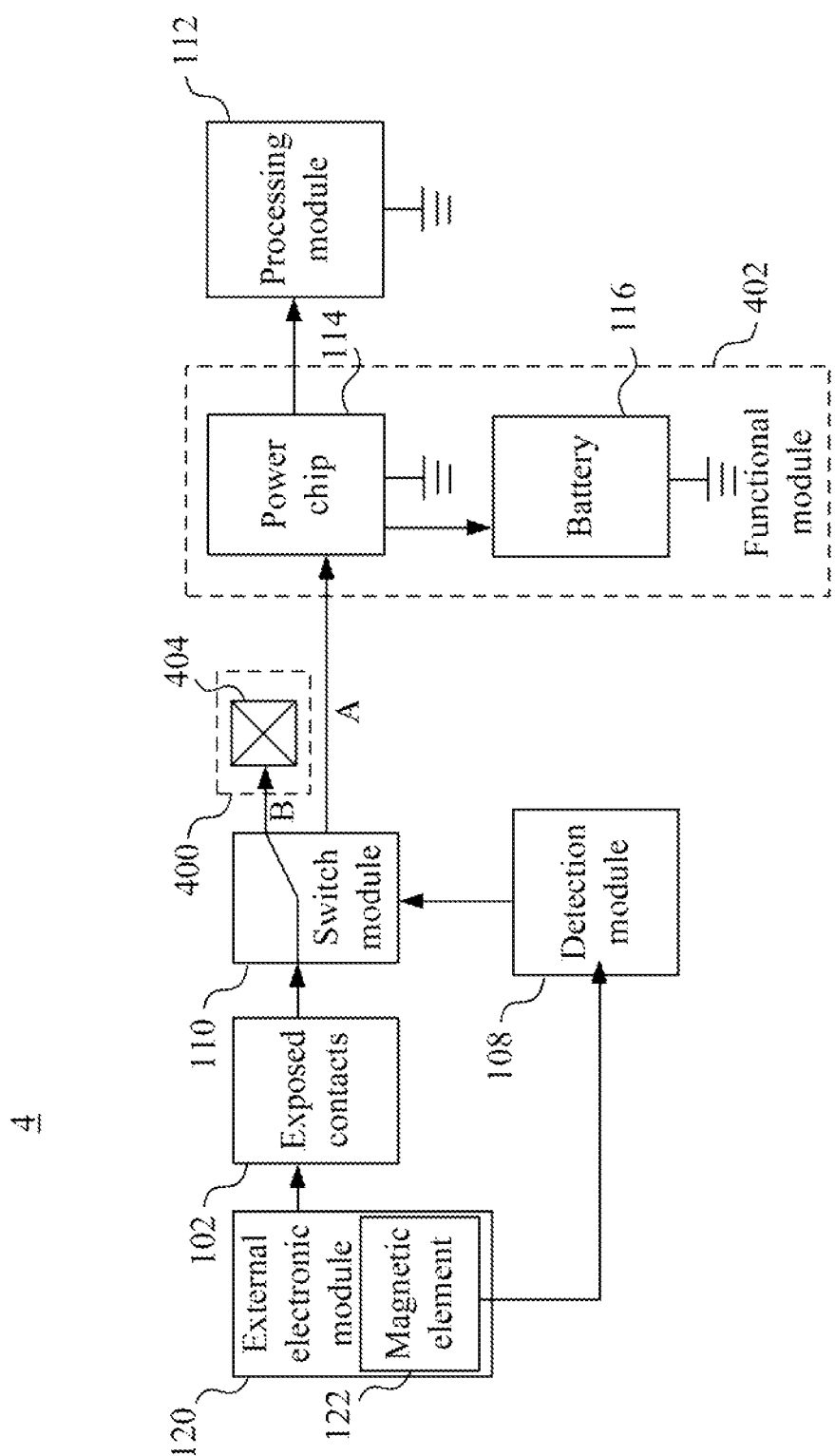
FIG. 4 is a block diagram of the wearable device in an embodiment of the present disclosure.

Reference is now made to FIG. 4. FIG. 4 is a block diagram of the wearable device 4 in an embodiment of the present disclosure. The wearable device 4 includes the exposed contacts 102, an ESD protection circuit 400, a functional module 402, the detection module 108 and the switch module 110. The exposed contacts 102, the detection module 108 and the switch module 110 are identical to those illustrated in FIG. 1B, and the functional module 402 is identical to the second functional module 104 illustrated in FIG. 18. As a result, these modules are not described in detail herein.

In the present embodiment, the ESD protection circuit 400 includes an open-circuit terminal 404 The open-circuit terminal 404 is such as but not limited to an open-circuit pad or an insulation pad.

By combining the operation of the detection module 108 and the switch module 110, the wearable device 4 in the present embodiment can detect whether the exposed contacts 102 are connected to the external electronic module 120 by using the detection module 108. The switch module 110 electrically connects the exposed contacts 102 and the functional module 402 through the path A when the detection module 108 determines that the exposed contacts 102 are connected to the external electronic module 120 such that the external electronic module 120 performs the transmission behavior with the functional module 402 through the exposed contacts 102. Further, the switch module 110 electrically connects the exposed contacts 102 and the ESD protection circuit 400 through the path B when the detection module 108 determines that the exposed contacts 102 are not connected to the external electronic module 120. As a result, when the ESD input occurs, the ESD protection circuit 400 guides the ESD input to the open-circuit terminal 404.

Figure 5:
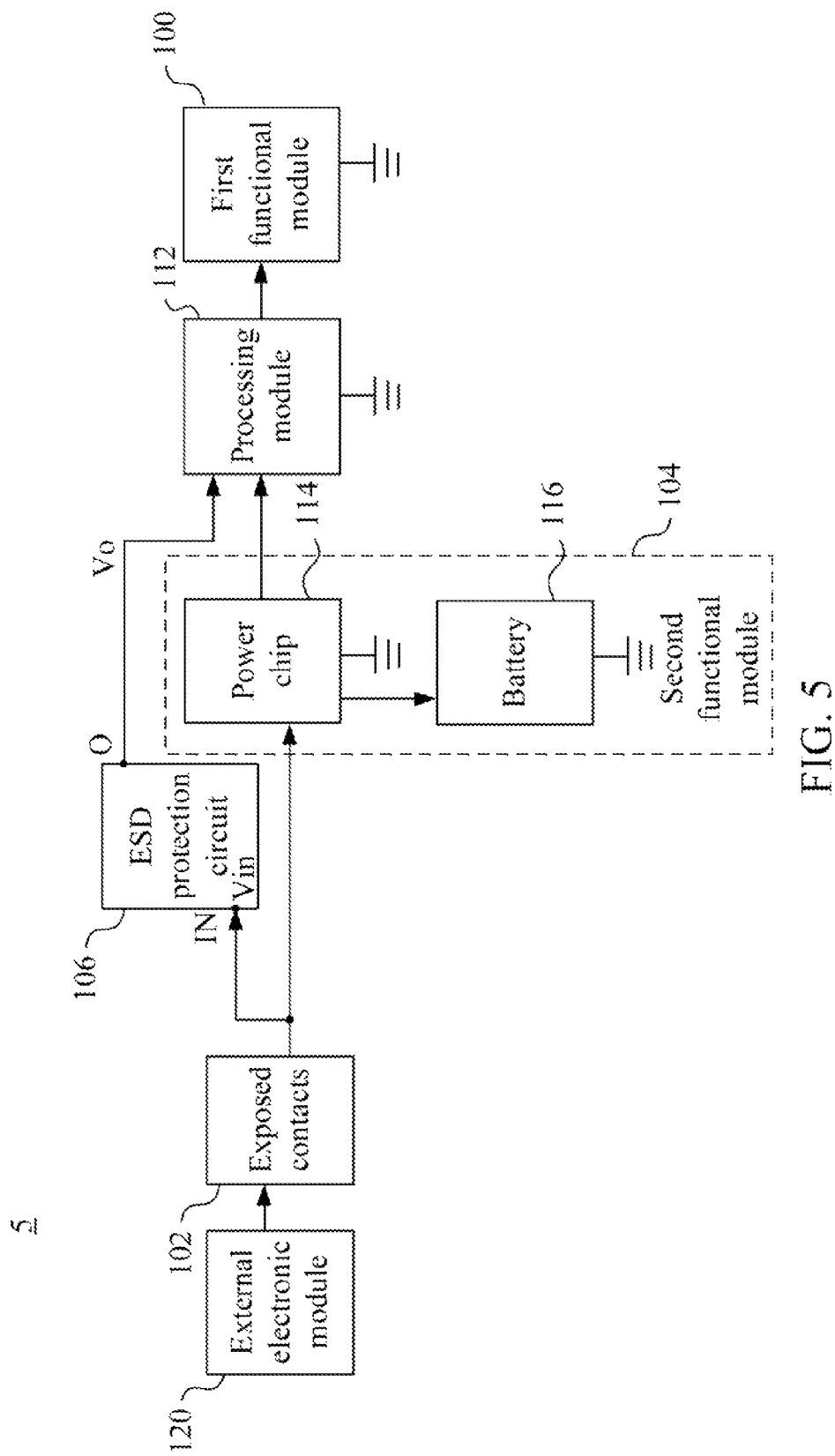
FIG. 5 is a block diagram of the wearable device in an embodiment of the present disclosure.

Reference is now made to FIG. 5. FIG. 5 is a block diagram of the wearable device 5 in an embodiment of the present disclosure. The wearable device 5 includes a first functional module 100, the exposed contacts 102, the second functional module 104, the ESD protection circuit 106 and the processing module 112. The exposed contacts 102, the second functional module 104, the ESD protection circuit 106 and the processing module 112 are identical to those illustrated in FIG. 1B. As a result, these modules are not described in detail herein.

In the present embodiment, the ESD input terminal IN of the ESD protection circuit 106 is electrically coupled between the exposed contacts 102 and the second functional module 104 such that when the ESD input occurs at the ESD input terminal IN, the ESD protection circuit 106 converts the ESD input having the first voltage value to the output voltage Vo having the second voltage value at the voltage output terminal O wherein the second voltage value is smaller than the first voltage value.

The processing module 108 receives the output voltage Vo to reset the first function module 100 according to the output voltage Vo. In an embodiment, the first functional module 100 described above is a module that is easy to perform false action due to the influence of the ESD, such as but not limited to a display module. As a result, the processing module 112 resets the first functional module 100 based on the generation of the ESD to avoid the false action of the first functional module 100 under the influence of the ESD, As a result, by using the designs of different types of the ESD protection circuit, the wearable device in the present disclosure not only prevents the disturbance of the ESD, but also prevents the false action of the functional module by using the reset mechanism.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A wearable device, comprising:
   a first functional module;
   at least one exposed contact;
   a second functional module;
   an ESD protection circuit, comprising an ESD input terminal and a voltage output terminal, wherein when an ESD input occurs at the ESD input terminal, the ESD protection circuit converts the ESD input having a first voltage value to an output voltage having a second voltage value at the voltage output terminal, wherein the second voltage value is smaller than the first voltage value;
   a detection module to detect whether the exposed contact is connected to an external electronic module;
   a switch module to electrically connect the exposed contact and the second functional module when the detection module determines that the exposed contact is connected to the external electronic module such that the external electronic module performs a transmission behavior with the second functional module through the exposed contact, and to electrically connect the exposed contact and the ESD input terminal of the ESD protection circuit when the detection module determines that the exposed contact is not connected to the external electronic module; and
   a processing module to receive the output voltage to reset the first function module according to the output voltage.

2. The wearable device of claim 1, wherein the processing module resets the first functional module when the output voltage is larger than a threshold value.

3. The wearable device of claim 1, wherein the processing module resets the first functional module every time the processing module receives the output voltage.

4. The wearable device of claim 1, wherein the processing module resets the first functional module when a number of times that the processing module receives the output voltage is larger than a predetermined value.

5. The wearable device of claim 1, wherein the first functional module is a display module.

6. The wearable device of claim 1, wherein the second functional module is a power module, the external electronic module is a charger, and the exposed contact is a charging contact, wherein when the detection module determines that the exposed contact is connected to the charger, the switch module electrically connects the charging contact with the power module such that the charger charges the power module through the charging contact.

7. The wearable device of claim 1, wherein the external electronic module comprises a magnetic element, and the detection module is a magnetic element detector to determine that the exposed contact is connected to the external electronic module when the magnetic element is detected.

8. The wearable device of claim 1, wherein the detection module is a voltage detector to determine that the exposed contact is connected to the external electronic module when a voltage value of the exposed contact larger than a predetermined value is detected.

9. The wearable device of claim 1, wherein the detection module is a mechanical detector to determine that the exposed contact is connected to the external electronic module when a connection of a corresponding pair of mechanical elements between the wearable device and the external electronic module is detected.

10. The wearable device of claim 1, wherein the detection module is a proximity detector to determine that the exposed contact is connected to the external electronic module when a distance shorter than a predetermined value between the wearable device and the external electronic module is detected.

11. The wearable device of claim 1, wherein the ESD protection circuit comprises:
    a clamping unit electrically coupled to the exposed contact when the exposed contact is connected to the external electronic module to clamp an input voltage of the exposed contact having a first voltage value below a predetermined level when an ESD input occurs;
    a first capacitive unit comprising a first terminal and a second terminal, wherein the first terminal is electrically coupled to the exposed contact to filter a direct current part of the input voltage, and the second terminal is electrically coupled to a voltage output terminal; and a second capacitive unit electrically coupled between the voltage output terminal and a ground terminal, so as to discharge to the processing module through the voltage output terminal to generate an output voltage having a second voltage value after being charged according to the input voltage from the first capacitive unit, wherein the second voltage value is smaller than the first voltage value.

12. The wearable device of claim 11, wherein the ESD protection circuit further comprises a resistor electrically coupled between the second terminal and the processing module.

13. A wearable device comprising:
at least one exposed contact;
a functional module;
an ESD protection circuit comprising an open-circuit terminal, wherein when an ESD input occurs, the ESD protection circuit guides the ESD input to the open-circuit terminal;
a detection module to detect whether the exposed contact is connected to an external electronic module; and
a switch module to electrically connect the exposed contact and the functional module when the detection module determines that the exposed contact is connected to the external electronic module such that the external electronic module performs a transmission behavior with the functional module through the exposed contact, and to electrically connect the exposed contact and the ESD protection circuit when the detection module determines that the exposed contact is not connected to the external electronic module.

14. The wearable device of claim 13, wherein the open-circuit terminal is an open-circuit pad or an insulation pad.

15. A wearable device comprising:
a first functional module;
at least one exposed contact;
a second functional module electrically coupled to the exposed contact such that when the exposed contact is connected to an external electronic module, the external electronic module performs a transmission behavior with the second functional module through the exposed contact;
an ESD protection circuit comprising an ESD input terminal and a voltage output terminal, wherein the ESD input terminal is electrically coupled between the exposed contact and the second functional module such that when an ESD input occurs at the ESD input terminal, the ESD protection circuit converts the ESD input having a first voltage value to an output voltage having a second voltage value at the voltage output terminal, wherein the second voltage value is smaller than the first voltage value; and
a processing module to receive the output voltage to reset the first function module according to the output voltage.

16. The wearable device of claim 15, wherein the first functional module is a display module.

17. The wearable device of claim 15, wherein the second functional module is a power module, the external electronic module is a charger, and the exposed contact is a charging contact, wherein the charger charges the power module through the charging contact.

* * * * *